United States Patent [19]

Jones

[11] 3,999,088

[45] Dec. 21, 1976

[54] HIGH VOLTAGE AC CONTROL DRIVING LOW VOLTAGE DEVICE TIMED BY COULOMETRIC CELL

[75] Inventor: John Paul Jones, Wayne, Pa.

[73] Assignee: Air Products and Chemicals, Inc., Allentown, Pa.

[22] Filed: Feb. 13, 1976

[21] Appl. No.: 658,091

[52] U.S. Cl. .............................. 307/308; 324/182; 340/309.1

[51] Int. Cl.$^2$ .......................................... H03K 3/26

[58] Field of Search ............. 307/308, 311; 324/94, 324/182, 188, 189; 340/309.1; 317/232

[56] References Cited

UNITED STATES PATENTS

| | | | |
|---|---|---|---|
| 3,355,731 | 11/1967 | Jones, Jr. ........................ | 340/309.1 |
| 3,405,274 | 10/1968 | Lakin ................................. | 324/94 |
| 3,938,128 | 2/1976 | Pidsosny et al. ................... | 324/192 |

*Primary Examiner*—Stanley D. Miller, Jr.
*Assistant Examiner*—B. P. Davis
*Attorney, Agent, or Firm*—James C. Simmons; Barry Moyerman

[57] ABSTRACT

A high voltage AC system for driving a low voltage device including a high voltage rectifier and a comparator for comparing the rectified signal with a predetermined voltage value for producing low voltage pulses. A coulometric timing circuit is coupled to the rectifier for providing current flow between the cathode and the filament of the coulometric cell for electrolytic erosion of the filament when high voltage is applied to the system. A transistor is adapted to drive the low voltage device in response to the low voltage pulses. The coulometric cell is coupled to the amplifier pair for preventing the amplifier from driving the low voltage device until the filament opens.

10 Claims, 6 Drawing Figures

HIGH VOLTAGE AC CONTROL DRIVING LOW VOLTAGE DEVICE TIMED BY COULOMETRIC CELL

BACKGROUND OF THE INVENTION

A. Field of the Invention

This invention relates to controlling an AC source to directly drive a low voltage device.

B. Prior Art

It has been desired to provide circuitry for controlling a high voltage AC source in order to directly drive a low voltage device. For such applications, the circuitry should dissipate a negligible amount of power and not be required to filter the ripple. The prior art has left much to be desired in providing a solution to this application particularly where there is further requirement that the circuitry be inexpensive and fit in a small space. The low voltage device to be driven may be a low voltage incandescent light bulb which may be turned on for a substantial amount of time to indicate the timing out of a coulometric timing cell as described, for example, in U.S. Pat. Nos. 3,355,731; 3,711,751; and 3,769,557. Once the light bulb has been turned on, it would be damaged by any one short time duration increase in voltage beyond its rating.

While transformers have been used to directly drive a low voltage device from a high voltage AC source, transformers are relatively costly and are objectionable here for weight and space considerations. While dropping resistors may take up less space than a transformer, they have substantially high power dissipation when used to drive a low voltage device requiring power such as an incandescent light bulb. Conventional SCR circuits also have many shortcomings for this type of drive application. Specifically, once turned on, a light bulb tracks the applied voltage and thus it is critical that the maximum peak potential applied to the light bulb not exceed its maximum voltage rating. However, an SCR circuit is sensitive to electrical disturbances on the line which may come, for example, from extraneous signals such as welding torches, circuit breakers, etc. These extraneous signals may turn on the SCR during a high voltage portion of the AC signal. Accordingly, a substantially high voltage may be applied to the low voltage device for no more than ½ cycle which would damage the low voltage device since it tracks its applied voltage.

As a result of cost and space considerations, voltage regulated power supplies would not be suitable for this drive application particularly since voltage regulated supplies have substantial and costly filtering while ripple is tolerated in driving a low voltage device such as a light bulb.

It is therefore a general object of this invention to provide a semiconductor circuit timed by a coulometric cell which controls a high voltage AC source to drive a low voltage device without any appreciable power dissipation within the circuit and without requiring filtering.

SUMMARY OF THE INVENTION

A high voltage AC system for driving a low voltage device when it is timed on by a coulometric cell. A high voltage rectifier produces a rectified signal from the AC and a comparator compares the rectified signal with a predetermined voltage value for producing low voltage pulses. A coulometric cell has a cathode electrode and an erodable anode filament disposed in an electrolyte solution. A coulometric timing circuit is coupled to the rectifier for providing current flow between cathode and filament in order to provide electrolytic erosion of the filament when the high voltage AC is applied to the system. First and second transistors are connected as an amplifier pair with the first transistor coupled to the comparator so that the amplifier pair is adapted to drive the low voltage device in response to the low voltage pulses. The coulometric cell is coupled to the amplifier pair for preventing the amplifier from driving the low voltage device until the filament opens due to electrolytic erosion.

DETAILED DESCRIPTION

Figure 1:
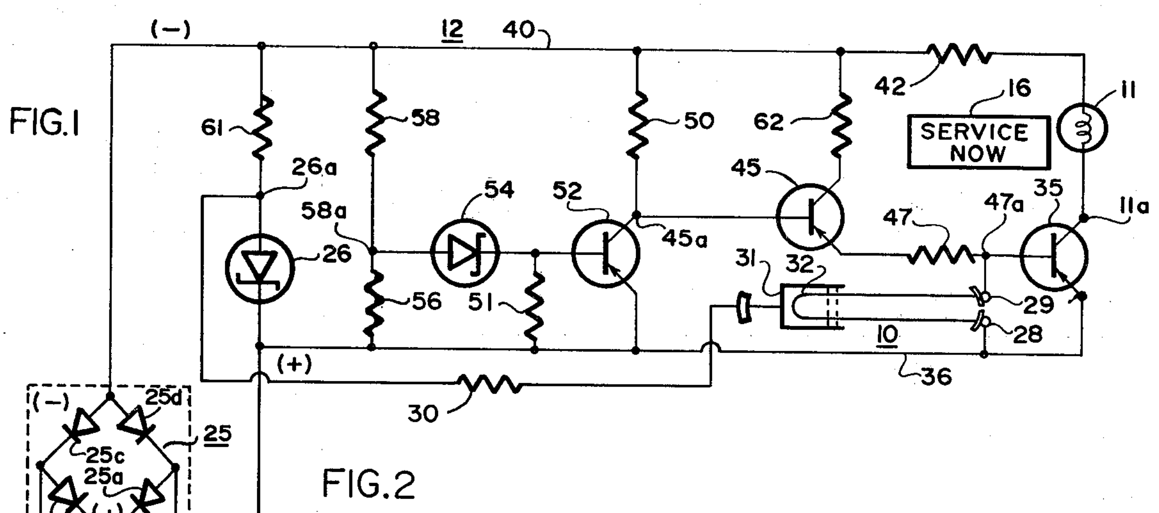
FIG. 1 illustrates in schematic form a high voltage AC system for driving a low voltage device in accordance with the invention.

Referring now to FIG. 1, there is shown a control or driving circuit 12 which is energized by a high voltage AC source 20 to directly drive a low voltage device 11 when a coulometric cell 10 has completed its predetermined timing period. Circuit 12 provides negligible power dissipation, does not have filtering, and provides device 11 with voltage pulses not exceeding the voltage rating of device 11 at the termination of the time delay of cell 10.

Device 11 may be a conventional low voltage, low power device such as an incandescent light bulb which operates at 12 volts and 80 milliamperes or 24 volts and 40 milliamperes. Bulb 11 tracks the voltage applied to it once the bulb has been turned on. Thus, bulb 11 would burn out if the applied voltage exceeded its maximum voltage rating since incandescent bulbs of this type quickly track their applied voltage even for a very short duration of time.

Bulb 11 having the brightness described, may be required in many applications such as to light up an annunciator panel 16 to indicate that a preset time duration has elapsed of the operation of an electromechanical device (not shown). Specifically, an AC high voltage source 20 of 110 V. AC, for example, is coupled in parallel with an electromechanical device so that AC is applied to circuit 12 only during the time that the electromechanical device is energized. The electromechanical device may be a motor, a generator, a pump or similar device which is required to be monitored for servicing where it is desired that the time that the motor is on be timed by a coulometric cell 10.

Coulometric cell 10 is generally described for example, in U.S. Pat. Nos. 3,355,731; 3,711,751; and 3,769,557 and may comprise a copper cup electrode or cathode 31, electrolyte solution 33, an erodable anode filament 32 and anode terminals 28,29. Filament 32 is connected between terminals 28 and 29 and when a predetermined potential is applied between terminal 28 and cathode electrode 31, current flows through the electrolyte and metal is plated away or eroded from filament 32 onto cup 31. By precisely selecting the dimensions and surface area of filament 32, the exact time of rupture of the conductive path between terminals 28 and 29 may be exactly controlled.

Figure 2:
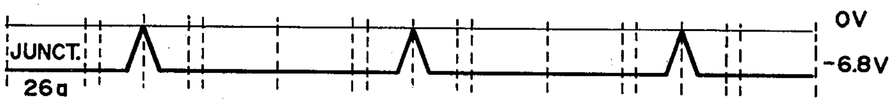
FIGS. 2–6 illustrate waveforms helpful in understanding the operation of FIG. 1.

The supply for cell 10 is maintained and regulated by Zener diode 26 and resistor 61 which may be selected to have a 6.8 volt potential across Zener diode 26. The full wave rectified source for this potential is provided by a full wave rectifier bridge 25 comprising four diodes 25*a–d* and source 20. Junction 26*a* of the anode of Zener diode 26 and resistor 61 is connected through a calibration or timing resistor 30 to cup cathode 31. Anode terminal 28 is coupled to positive bus 36 and then to the cathode of Zener diode 26. Thus, the regulated voltage drop of −6.8 volts across Zener diode 26 as shown in FIG. 2, provides the source for current flow through resistor 30 and cell 10 to provide the current for the coulometric timing circuit.

Zener diode 26 operates in conjunction with resistor 61 as a separate regulated voltage source for cell 10 and is not affected by variations in current flow through calibration resistor 30. Current flow through Zener diode 26 may be traced by way of the positive side of bridge 25, positive bus 36, Zener diode 26, resistor 61, negative bus 40 and then to the negative side of bridge 25. Current flows through the Zener diode except just before and just after times $t_1$, $t_4$, $t_7$, etc. since the potential drop across the Zener diode 26 during these times as shown in FIG. 2 is insufficient to break down.

Figure 5:
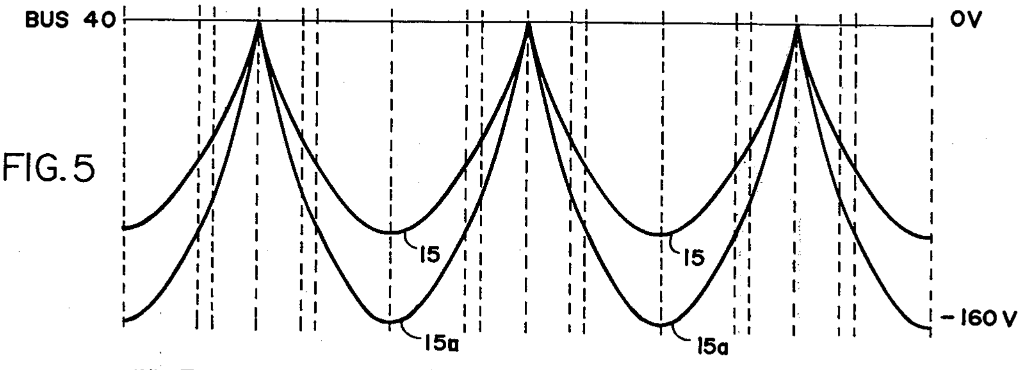

Full wave rectifier waveform 15 at bus 40 produced by bridge 25 is shown in FIG. 5. This full wave rectified voltage 15 is applied through a protective resistor 42 and device 11 to a collector of a PNP power transistor 35. Transistor 35 is connected in a grounded emitter configuration with its emitter connected to bus 36. Accordingly, transistor 35 operates as a "power switch" and is capable of driving relatively high currents through bulb 11 which represents its collector load. However, with filament 32 unbroken, the base of transistor 35 is shorted to its emitter and thus transistor 35 is off and there is no current flow through that transistor and load 11. Further, full wave rectified voltage 15 is also applied through resistor 50 and junction 45*a* to the base of a PNP transistor 45 connected as an emitter follower. The rectified voltage is also applied through a collector resistor 62 to the collector of transistor 45. The emitter of transistor 45 is connected through a dropping resistor 47 and a junction 47*a* for driving the base of transistor 35. With filament 32 unbroken, resistor 47 is used for dropping the potential appearing at the emitter of transistor 45.

Figure 3:
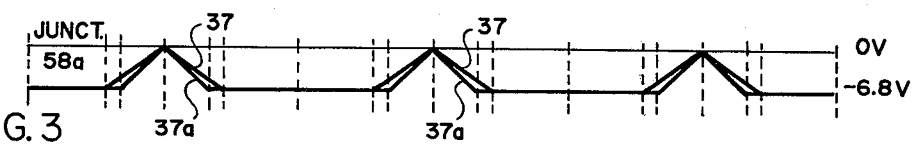
Figure 4:
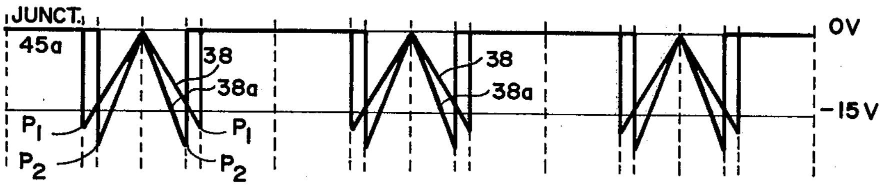

The "firing point" $P_1$ as shown in FIG. 4 is determined by a comparator circuit comprising resistors 51, 56 and 58, Zener diode 54 and transistor 52. The voltage at junction 58*a*, illustrated in FIG. 3 by waveform 37, is determined by the voltage divider action of series resistors 58, 56 as well as Zener diode 54 and resistor 51 connected in series between junction 58*a* and bus 36. The relative values of resistors 58, 56 determine when the regulating Zener diode 54 breaks down or conducts current. The voltage divider network 58, 56 is separated from resistor 61 and Zener diode 26 to avoid interaction between the operation of cell 10 and the comparator circuit. When Zener diode 54 conducts current, a current path may be traced from bus 40, resistors 58 and 56 to positive bus 36. A parallel path may be traced through Zener diode 54 and resistor 51 to bus 36. Further, when Zener 54 conducts, it conducts current into the base of transistor 52 thereby turning on that transistor.

With rectified waveform 15 applied between buses 40 and 36, the values of resistors 56 and 58 may be such that junction 58*a* reaches towards a portion of the rectified signal such as −15 volts, for example. However, before junction 58*a* reaches −15 volts, Zener 54 conducts and thus as shown in FIG. 3 before time $t_0$, (and between times $t_2$–$t_3$, $t_5$–$t_6$, etc.) for example, the potential at junction 58*a* is maintained at −6.8 volts. As shown in FIG. 5, at time $t_0$, waveform 15 on bus 40 approaches zero volts until the absolute magnitude of the potential at junction 58*a* decreases to a value where Zener diode 54 turns off. Thereafter, as shown by waveform 37, FIG. 3, junction 58*a* follows waveform 15 through the voltage divider action of resistors 58, 56 until the junction reaches 0 volts at time $t_1$. Between times $t_1$–$t_2$, junction 58*a* increases in magnitude in a negative direction following waveform 15 until time $t_2$ when the potential of junction 58*a* is sufficient to turn on Zener 54 and junction 58*a* is maintained at −6.8 volts from time $t_2$ to time $t_3$.

Transistor 52 is turned on thereby shorting junction 45*a* to bus 36 when Zener diode 54 conducts between times $t_2$–$t_3$, $t_5$–$t_6$, etc. However, during times $t_0$–$t_2$, $t_3$–$t_5$, $t_6$–$t_8$, etc. transistor 52 is turned off by waveform 37 and thus the potential at junction 45*a* provides low voltage pulses 38 of approximately −15 volt amplitude which are effective to turn on transistor 45 during these intervals. Accordingly, pulses 38 are produced only during the time of nonconduction of both Zener diode 54 and transistor 52.

While pulses 38 applied to transistor 45 are effective to turn on that transistor, the conduction of transistor 45 has no effect on the conduction of transistor 35 since its base is effectively shorted to its emitter. However, at the time that filament 32 opens or parts, transistor 35 can then go into conduction during pulses 38 which occur at times $t_0$–$t_2$, $t_3$–$t_5$, etc. It is in this way that transistor 35 is turned on and load 11 is energized during the time of low voltage pulses 38.

Figure 6:
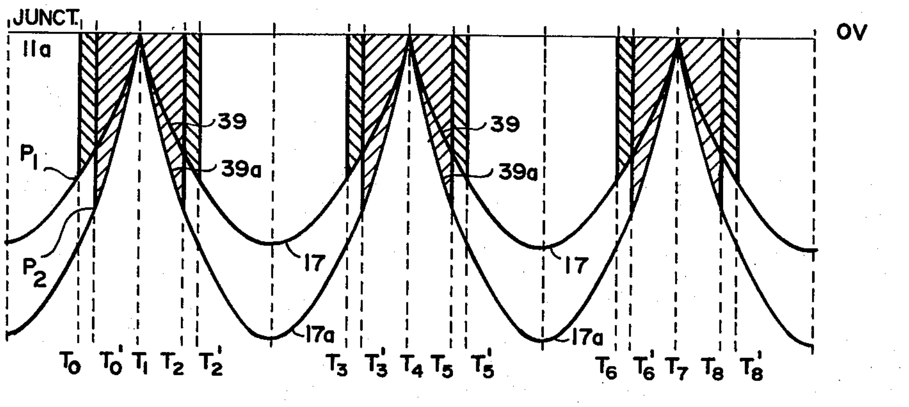

The shaded area 39 under curve 17 in FIG. 6 represents the energy supplied to load 11 during conduction. It will be understood that the larger this area 39, the brighter bulb 11 shines. On the other hand, as area 39 gets smaller, bulb 11 will shine more dimly. Thus, for example, if the amplitude of AC source 20 increases, then rectified waveform 15*a* is produced as shown in FIG. 5. In the manner previously described, waveform 15*a* is applied by way of the voltage dividing network 58, 56 to Zener diode 54 and thus the waveform at junction 58*a* appears as shown by waveform 37*a* in FIG. 3. The decreased width of waveform 37*a* results because junction 58*a* reaches towards a higher voltage and thus Zener diode 54 conducts sooner at time $t_2'$ for example. Accordingly, the conduction period decreases in time to the intervals of $t_0'$–$t_2'$, $t_3'$–$t_5'$, etc. resulting in narrower pulses 38*a* at junction 45*a*. These narrower pulses in turn cause the area under the curve 39*a*, FIG. 6 to be decreased and thus, after time out, bulb 11 gets slightly dimmer. Accordingly, it will be understood that the pulse width of the pulses shown in FIGS. 3 and 4 are inversely proportional to the magnitude of the rectified signal. It is in this way that the comparator circuit acts as an overvoltage protection network.

Further, the total current drain during time outs is kept to a minimum since the current requirement for each of the individual legs of the voltage divider networks, viz, resistors 56, 58 and resistor 61 and Zener 26, can be made as low as possible. These components can be selected to the needs of individual cell 10 and transistors 35, 45. In addition, transistor 45 is connected as an emitter follower current amplifier and in an example, may draw only 20 mA average current thus keeping the power consumption during the time out period to a minimum.

After time out, transistors 35, 45 are either fully conducting during times $t_0$–$t_2$, etc. or fully cut off during times $t_2$–$t_3$, etc. and thus there is negligible power dissipation by these transistors. It is in this way that system 12 operates with minimum power dissipation while still providing the necessary drive for load 11.

What is claimed is:

1. A high voltage AC system for driving a low voltage device when it is timed on by a coulometric cell comprising:

a high voltage rectifier for producing a rectified signal from said AC, comparator means for comparing said rectified signal with a predetermined voltage value for producing low voltage pulses, said coulometric cell having a cathode electrode and an erodable anode filament disposed in an electrolyte solution, coulometric timing circuit means coupled to said rectifier for providing current flow between said cathode and said filament thereby to provide electrolytic erosion of said filament when said high voltage AC is applied to said system, first and second transistors connected as an amplifier pair, said first transistor coupled to said comparator whereby said amplifier pair is adapted to drive said low voltage device in response to said low voltage pulses, and said coulometric cell coupled to said amplifier pair for preventing said amplifier from driving said low voltage device until said filament opens due to electrolytic erosion.

2. The high voltage AC system of claim 1 in which said comparator means includes means for voltage dividing the rectified signal for providing a portion of the rectified signal, regulating diode means coupled to said voltage dividing means for conducting only as long as the rectified signal portion is greater in magnitude than said predetermined voltage value whereby said low voltage pulses (1) are produced only during the time of nonconduction of said regulating diode means and (2) have a width inversely proportional to the magnitude of said rectified signal.

3. The high voltage AC system of claim 2 in which said comparator means includes semiconductor means coupled to said regulating diode means for conduction and nonconduction when said regulating diode means is conducting and nonconducting respectively for producing said low voltage pulses only during nonconduction of said semiconductor means.

4. The high voltage AC system of claim 3 in which said regulating diode means is a Zener diode coupled between said voltage driving means and semiconductor means.

5. The high voltage AC system of claim 2 in which said coulometric cell having first and second anode terminals with said anode filament coupled between said anode terminals, said first and second anode terminals coupled respectively to a base and an emitter of said transistor amplifier pair to short out said base turning off said transistor amplifier pair and preventing said amplifier pair from driving said low voltage device until said filament electrode opens due to electrolytic erosion.

6. The high voltage AC system of claim 5 in which said low voltage device is an incandescent light bulb which tracks its applied voltage.

7. The high voltage AC system of claim 6 in which collectors of said first and second transistors are coupled to one side of said light bulb and the base of said transistor is coupled to a collector of said semiconductor means.

8. The high voltage AC system of claim 7 in which said coulometric timing circuit means includes voltage regulator means coupled between said comparator means and said rectifier for producing across said cathode and one of said anode terminals a regulated low voltage for producing said electrolytic erosion current flow.

9. The high voltage AC system of claim 8 in which said high voltage rectifier is full wave diode rectifier.

10. The high voltage AC system of claim 9 in which said voltage regulator means comprises a Zener diode coupled between said comparator means and said full wave rectifier.

* * * * *